United States Patent [19]

Boland et al.

[11] Patent Number: 5,084,407
[45] Date of Patent: Jan. 28, 1992

[54] METHOD FOR PLANARIZING ISOLATED REGIONS

[75] Inventors: Bernard W. Boland, Scottsdale; Barbara Vasquez, Chandler; James Jen-Ho Wang, Tempe, all of Ariz.

[73] Assignee: Motorola, Inc., Schaumburg, Ill.

[21] Appl. No.: 709,928

[22] Filed: Jun. 3, 1991

[51] Int. Cl.$^5$ .............................. H01L 21/302
[52] U.S. Cl. ..................... 437/61; 437/228; 437/89; 437/99; 437/62
[58] Field of Search ............ 437/228, 89, 61, 62, 437/63, 64, 99

[56] References Cited

U.S. PATENT DOCUMENTS 4,462,847  7/1984  Thompson et al. ............. 437/99
4,566,914  4/1986  Hall ............................... 437/89

FOREIGN PATENT DOCUMENTS 0084437  5/1984  Japan ............................. 437/99
0172247  9/1984  Japan ............................. 437/89

*Primary Examiner*—Brian E. Hearn
*Assistant Examiner*—Trung Dang
*Attorney, Agent, or Firm*—Joe E. Barbee

[57] ABSTRACT

A method is described for planarizing isolated regions (12) and active regions (22) of a semiconductor wafer (10). Semiconductor wafer (10) is provided with islands of dielectric (12) that cover portions of the semiconductor wafer (10), while leaving other portions of the semiconductor wafer (10) exposed. The dielectric islands (12) have a polysilicon layer (13) that covers the dielectric islands' (12) top surface. A blanket layer of silicon is deposited on the polysilicon layer (13) that covers the top surface of the dielectric islands and is deposited between the dielectric islands (12). Planarizing the blanket layer of epitaxial silicon is achieved by a chemical-mechanical means, thereby producing a planar surface of isolated areas (12) and active areas (22).

9 Claims, 1 Drawing Sheet

5,084,407

METHOD FOR PLANARIZING ISOLATED REGIONS

BACKGROUND OF THE INVENTION

This invention relates, in general, to semiconductor products and more particularly, to processing of semiconductor materials.

Conventionally, isolation of active areas on a semiconductor device is generally achieved by nonplanarizing methods, such as local oxidation of silicon (LOCOS). The LOCOS method, while achieving adequate isolation of active areas, does not satisfy a growing requirement for vertical sidewalls, planarity of both active areas and isolation areas, and potential for deeper isolation elements. These requirements for vertical sidewalls, greater planarity, and deeper isolation are driven by semiconductor devices that are smaller, denser, and that have a larger number of layers that are vertically stacked. Isolation with vertical sidewalls results in a lower parasitic capacitance, thereby resulting in better device performance. However, by not achieving planarity of the active areas and the isolation areas, problems result, such as wasting potential active area space, not being able to process subsequent layers by photolithographic and etch methods, as well as not being able to manufacture efficiently advanced semiconductor devices.

Several methods have been tried unsuccessfully to provide a high aspect ratio isolation with coplanar active areas and isolation areas, such as poly-buffered LOCOS, selective epitaxial growth, and polishing of dielectric materials. Each of these methods either does not achieve adequate planarity of the semiconductor device, results in unacceptable parasitic capacitance, or is so difficult that the method is not commonly used in manufacturing.

It can be seen that conventional isolation methods are not adequate for achieving planarity between the active areas and the isolation areas for manufacturing advanced semiconductor devices. Therefore, a method that would result in a planar active area and a planar isolation area would be highly desirable. Additionally, a method that not only achieves planarity, but also is inexpensive and is easy to implement would also be desirable.

SUMMARY OF THE INVENTION

Briefly stated, according to the invention, a method is described for planarizing isolation regions and active regions of a semiconductor wafer. A semiconductor wafer is provided with islands of dielectric material that cover portions of the semiconductor wafer, while leaving other portions exposed. The dielectric islands have a polysilicon layer covering the dielectric islands' top surface. A blanket layer of silicon is deposited between the dielectric islands on the exposed portions of the semiconductor wafer, and on the polysilicon layer covering the top surface of the dielectric islands. The blanket layer of silicon is then planarized by a chemical-mechanical means, thereby producing a planar surface of isolation areas and active areas, wherein the dielectric islands are the isolation areas.

DETAILED DESCRIPTION OF THE DRAWINGS

Figure 1:
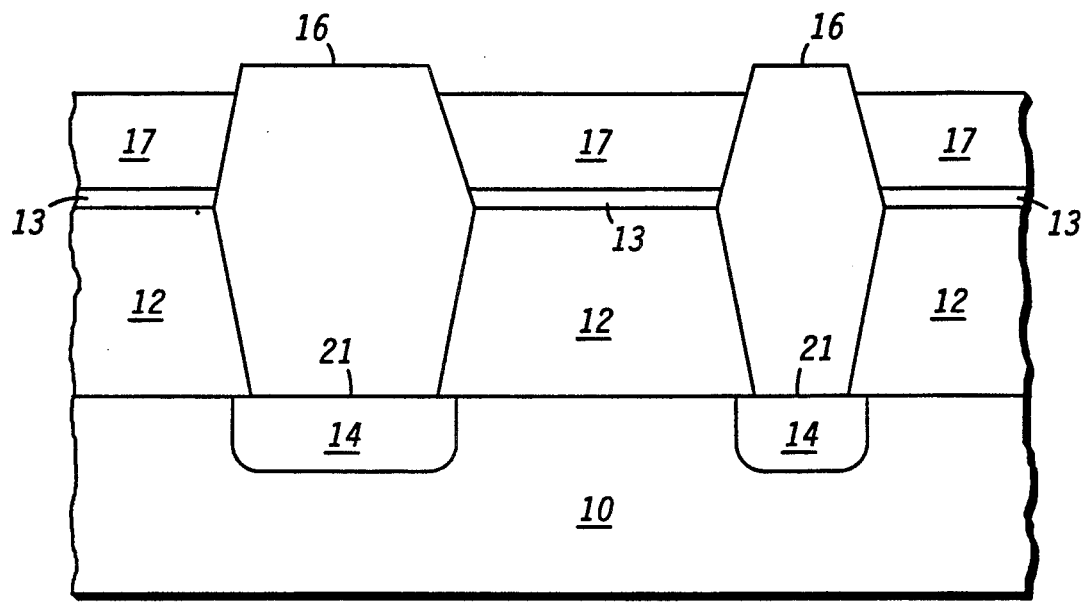
FIG. 1 is a simplified cross-sectional illustration of a semiconductor wafer that has been prepared and processed through epitaxial deposition in accordance with the present invention.

FIG. 1 is a simplified cross-sectional illustration of a semiconductor wafer 10 that has been processed through epitaxial deposition. In the present invention, planarization of active areas and isolation areas is achieved by an unique combination of processes. However, several preliminary steps are required to prepare semiconductor wafer 10 for planarization. Generally, semiconductor wafer 10 is made of silicon; however, semiconductor wafer 10 can be made of other suitable materials, such as gallium arsenide.

Semiconductor wafer 10 is prepared by making a channel stop (not shown) prior to forming dielectric islands 12. It should be understood that the channel stop, while being necessary or advantageous in some applications, is not necessary nor advantageous in other applications. Therefore, the channel stop may or may not be formed in semiconductor wafer 10. Accordingly, the channel stop will herein be assumed to be in place where appropriate.

Dielectric islands 12 are made either by depositing or growing a continuous dielectric layer on semiconductor wafer 10. A continuous polysilicon layer is then deposited on the continuous dielectric layer. It should be understood that FIG. 1 does not show the continuous dielectric layer or the continuous polysilicon layer, but does show these layers after a subsequent etch process as dielectric islands or areas 12 and polysilicon layer 13. Methods for depositing or growing the continuous dielectric layer and depositing the continuous polysilicon layer are well-known in the semiconductor art and need not be discussed herein. However, thickness of the continuous dielectric layer ranges from 0.5 micron to 3.0 microns, with the thickness of the continuous dielectric layer substantially adjusted to 1.0 micron, and thickness of the continuous polysilicon layer ranges from 0.08 micron to 0.5 micron with the thickness of the continuous polysilicon layer substantially adjusted to 0.2 micron. Additionally, the continuous dielectric layer can be made of several materials, such as silicon dioxide, silicon nitride, or any suitable dielectric.

Typically, patterning of the continuous polysilicon layer and the continuous dielectric layer is achieved by well-known methods in the semiconductor art. Additionally, patterning of both the continuous polysilicon layer and the continuous dielectric layer with conventional patterning methods allows selection of a predetermined slope of sidewalls of dielectric islands 12 and polysilicon layer 13. The predetermined slope is dependent on each specific application; however, vertical or near vertical sidewalls of dielectric islands 12 are preferred in a high performance semiconductor device. Vertical sidewalls of dielectric island 12 increases the performance of the semiconductor device by several mechanisms, such as reduced parasitic capacitance and reduction of isolation process bias. Process bias is the dimensional or size difference between a photolithographically defined feature and a final dimension or size of that same feature.

Patterning the continuous polysilicon layer and the continuous dielectric layer exposes a surface 21 of semiconductor wafer 10. Generally, dopant region 14 is formed in semiconductor substrate 10 by ordinary ion implantation and diffusion methods known in the semiconductor art. Doping region 14 in semiconductor substrate 10 is now self-aligned since dielectric islands 12 prevent dopant from entering areas of semiconductor substrate 10 that are covered by dielectric islands 12. Dopant region 14 can be a variety of different semiconductor device structures, such as a buried layer, an n-well, or a p-well. Selection of the various device structures is achieved by implantation and diffusion of different dopants into exposed surface 21 of semiconductor wafer 10. Additionally, individual selection of exposed surface 21 can be achieved by conventional photolithographic masking, thereby allowing implantation of different dopants into selected exposed areas 21. This individual selection of exposed surface 21 allows for combining several device structures to be made on the same semiconductor substrate 10.

In the present invention, after forming polysilicon covered dielectric islands 12, semiconductor wafer 10 is covered with a blanket layer of silicon. It should be understood that normal cleaning procedures, such as a hydrofluoric acid etch or a hydrochloric acid etch are used to clean semiconductor wafer 10 for epitaxial deposition. The blanket layer of silicon is deposited in a conventional epitaxial manner, thereby depositing silicon on exposed portions 21 of semiconductor wafer 10, as well as on polysilicon layer 13. However, since exposed portions 21 of semiconductor wafer 10 are single crystal in nature and polysilicon layer 13 is polycrystalline in nature, two different depositions occur at the same time. Deposition on exposed surface 21 is organized as a single crystal, forming epitaxial silicon 16, and deposition on polysilicon layer 13 is organized as polycrystalline, forming polysilicon layer 17. Therefore, polysilicon layer 13 controls deposition on top of dielectric islands 12 and allows a polycrystalline film to be formed, while single crystal deposition is allowed to form in exposed portions 21. The epitaxial deposition is continued until the desired thickness is achieved. Typically, the desired thickness of the epitaxial silicon is dependent on a width of exposed area 21 and a height of dielectric 12 plus a height of polysilicon layer 13. Generally, it is preferred that exposed areas 21 be filled to just over polysilicon layer 13.

Once the blanket epitaxial deposition is satisfactorily completed, semiconductor wafer 10 is ready for planarization.

Figure 2:
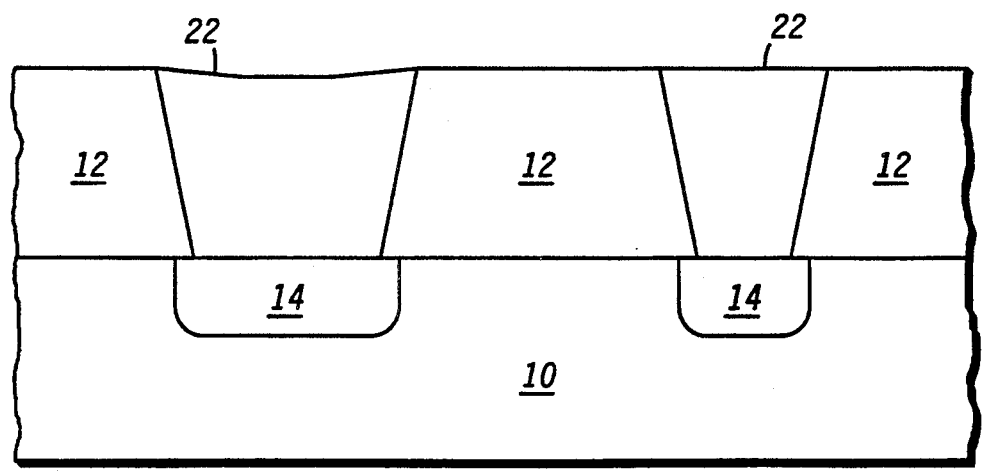
FIG. 2 is a simplified cross-sectional illustration of the semiconductor wafer of FIG. 1 that has been planarized by a chemical-mechanical means.

FIG. 2 is a simplified cross-sectional illustration of semiconductor wafer 10 that has been chemically-mechanically processed which is typically achieved in a polishing system. Semiconductor wafer 10 as received from FIG. 1 is processed by a chemical-mechanical means, so as to remove polysilicon layer 17, and polysilicon layer 13 to form a planar surface having dielectric or isolation areas 12 and active areas 22.

In the present invention, the chemical-mechanical process is achieved by a polishing process that removes material by combining both a mechanical and a chemical process. By using the conventional polishing processes, selective or differing removal rates between material can be achieved. By way of example, using a conventional slurry and a conventional equipment set up for polishing or removing silicon, epitaxial silicon 16, polysilicon layer 17, and polysilicon layer 13 are removed at a rate of 25,000 angstroms per minute, whereas dielectric 12 typically is removed at a rate of 100 angstroms per minute. This differential removal rate of 250.0 angstroms of silicon for every 1.0 angstrom of dielectric allows for removal of epitaxial silicon 16, polysilicon layer 17, and polysilicon layer 13 stopping on dielectric 12. Thus, providing both a planar isolation area or dielectric area 12 and planar silicon active areas 22. Further, by using dielectric 12 as a stop, thickness of epitaxial silicon 16 is controlled by the thickness of dielectric 12. Accordingly, thickness of planar silicon active areas 22 are easily determined because the thickness of dielectric 12 is easily measured. Additionally, conventional cleaning methods are used to remove slurry residue from semiconductor wafer 10 after the polishing process.

In another embodiment of the present invention polysilicon layer 17 is removed, and portions of polysilicon layer 13 and epitaxial silicon 16 are also removed, leaving a thin layer of polysilicon 13 that is planar with epitaxial silicon 16. The thickness of the thin layer ranges from approximately between 200 angstroms and 2,000 angstroms on dielectric 12. This small amount of polysilicon is then oxidized, converting the thin layer of polysilicon to silicon dioxide, while an approximately equal amount of epitaxial silicon is converted into silicon dioxide. This converted silicon dioxide can be removed by subsequent processing in hydrofluoric acid.

Coplanarity of both dielectric areas 12 and silicon active areas 22 is easily achieved in the present invention. Achieving coplanarity of active areas 22 and dielectric areas 12 results in reduced parasitic capacitance in the semiconductor device, better performance of the semiconductor device, adequate planarity of both dielectric areas 12 and silicon active areas 22, with a lower cost.

By now it should be appreciated that there has been provided a method for a providing a vertical walled isolation with coplanar active and isolation areas. The deposition of epitaxial silicon on two different exposed materials which forms two different material types and subsequent removal of these two materials by chemical and mechanical means provides a planar isolation and a planar active area.

What is claimed is:

1. A method for planarizing both an active area and a dielectric area on a semiconductor wafer comprising:
    providing the semiconductor wafer with both a patterned dielectric that is on the semiconductor wafer with a patterned polysilicon layer that is on the patterned dielectric, thereby exposing portions of the semiconductor wafer;
    depositing a blanket layer of silicon over the patterned polysilicon layer and on the exposed semiconductor wafer; and
    planarizing the blanket layer of silicon by a chemical-mechanical means, thereby making a planarized surface.

2. The method of claim 1 further comprising stopping the chemical-mechanical means at a predetermined point above the dielectric and oxidizing a remaining amount of residual patterned polysilicon layer that is over the patterned dielectric and further removing the oxidized polysilicon by hydrofluoric acid.

3. The method of claim 1 further comprising making the patterned dielectric of silicon dioxide.

4. The method of claim 2 further comprising making the patterned dielectric of silicon nitride.

5. The method of claim 1 further comprising making the semiconductor wafer of silicon.

6. The method of claim 5 further comprising making the semiconductor wafer of gallium arsenide.

7. The method of claim 1 further comprising having the chemical-mechanical means be a semiconductor wafer polishing system.

8. The method of claim 1 further including making the patterned dielectric with sidewalls having a predetermined slope.

9. A method for making both an active silicon region and a dielectric region self-aligned to a doped region comprising:

providing a semiconductor substrate;

providing a channel stop region on the semiconductor substrate;

depositing a dielectric layer on the silicon substrate;

depositing a polysilicon layer on the dielectric layer;

patterning the polysilicon layer and the oxide layer, thereby exposing portions of the semiconductor substrate and creating islands of dielectric with polysilicon on top of the dielectric islands;

depositing a blanket layer of epitaxial silicon on the patterned semiconductor substrate, wherein the epitaxial silicon is deposited and fills between the dielectric islands and also is deposited on the polysilicon layer; and removing the epitaxial silicon by a chemical-mechanical means that is on the polysilicon layer, thereby producing a planar surface.

* * * * *